(12) United States Patent
Huber et al.

(10) Patent No.: US 6,191,995 B1
(45) Date of Patent: Feb. 20, 2001

(54) SHARING SIGNAL LINES IN A MEMORY DEVICE

(75) Inventors: Brian W. Huber, Allen; Todd A. Dauenbaugh, Richardson, both of TX (US)

(73) Assignee: Micron Technology, Inc., Boise, ID (US)

(*) Notice: Under 35 U.S.C. 154(b), the term of this patent shall be extended for 0 days.

(21) Appl. No.: 09/386,101

(22) Filed: Aug. 30, 1999

(51) Int. Cl.[7] .................................................. G11C 13/00
(52) U.S. Cl. .................................. 365/230.01; 365/230.03
(58) Field of Search ...................... 365/189.01, 189.04, 365/230.01, 230.03, 51

(56) References Cited

U.S. PATENT DOCUMENTS 4,202,044 * 5/1980 Beilstein ............................ 365/182
5,493,536 * 2/1996 Aokl ................................ 365/230.05

OTHER PUBLICATIONS

Micron Technology, Inc., *Direct Rambus™Dram*, Rev. Feb. 1999, pp. 1–3 (Feb. 1999).
Rambus, Inc., *Rambus® Technology Overview*, pp. i–10 (Feb. 12, 1999).
Rambus Inc., *Document DL0059, Version 1.0*, Direct RDRAM Preliminary Information, pp. 1–42, dated at least as early as Jul. 6, 1999.

* cited by examiner

*Primary Examiner*—Terrell W. Fears
(74) *Attorney, Agent, or Firm*—Trop, Pruner & Hu

(57) ABSTRACT

A memory device includes a memory array and at least two sets of row decoders to drive row lines in the memory array. Select lines (such as row select lines) carry signals to select one or more decoders in one of the two sets of decoders. At least some of the select lines are shared between the two sets of row decoders to decrease the space needed to route signal lines in the memory array.

28 Claims, 6 Drawing Sheets

SHARING SIGNAL LINES IN A MEMORY DEVICE

BACKGROUND

The invention relates to sharing signal lines in a memory device.

Memory devices are commonly used as storage units in many types of electronic systems, such as computer systems, consumer electronic devices, game systems, communications systems and devices, and other systems. Various types of memory devices exist, including dynamic random access memories (DRAMs), synchronous DRAMs (SDRAMs), Rambus DRAMs (RDRAMs), static RAMs (SRAMs), double data rate DRAMs (DDR DRAMs), and so forth.

A significant factor in the cost of a memory device is its overall die size. Memory dies are fabricated on a wafer. The number of dies that can be fit onto a wafer depends on the die size. A smaller die size generally allows more dies to be placed on a wafer, which generally increases yield of the manufactured memory dies. Yield refers to the percentage of good dies (i.e., those that are functional and that satisfy certain timing and voltage specifications) out of the total number of dies manufactured. The good dies are cut from the wafer and packaged to form integrated circuit (IC) devices.

Reduced die sizes may also have other advantages. For example, it is desirable to reduce the footprint of integrated circuit (IC) devices on a circuit board, such as the motherboard of a computer system, to allow greater density of IC devices on the circuit board. One way to reduce such IC device footprints is to reduce the package size, which may be made possible by reducing die sizes.

A memory device such as a DRAM, SDRAM, RDRAM, SRAM, DDR DRAM, and the like, generally includes a memory core and peripheral circuitry associated with the memory core. The memory core includes the memory cells, sense amplifiers coupled to the memory cells, row decoders that drive row lines (such as word lines) to activate a row of cells, and other components. The peripheral circuitry generally includes address decode logic, data input and output buffers, multiplexing logic, clock generators, data latches and other logic and circuitry. Because of the number of bits that are stored in memory devices, the memory core typically makes up a large part of the size of a memory device. Select signals (such as address select signals) from the peripheral circuitry are routed into the memory core on signal lines to control access of memory cells in the memory core. Depending on the architecture of the memory device, many of the control signal lines may be repeated several times throughout the memory core. As a result, the space needed for routing such signal lines may take up a substantial part of the size of a memory die. A need thus exists for methods and circuitry that provide for more efficient usage of memory die space by decreasing the number of signal lines.

SUMMARY

In general, according to one embodiment, a memory device includes a plurality of memory cells. First control circuits drive control lines to a first set of memory cells, and second control circuits drive control lines to a second set of memory cells. Shared select lines that are coupled to both the first and second control circuits alternately carry signals associated with the first and second control circuits.

Other features and embodiments will become apparent from the following description and from the claims.

DETAILED DESCRIPTION

In the following description, numerous details are set forth to provide an understanding of the present invention. However, it is to be understood by those skilled in the art that the present invention may be practiced without these details and that numerous variations or modifications from the described embodiments may be possible. For example, although one arrangement of a memory device is described, the invention is not to be limited in this respect since other embodiments may have different arrangements and architectures.

Figure 1:
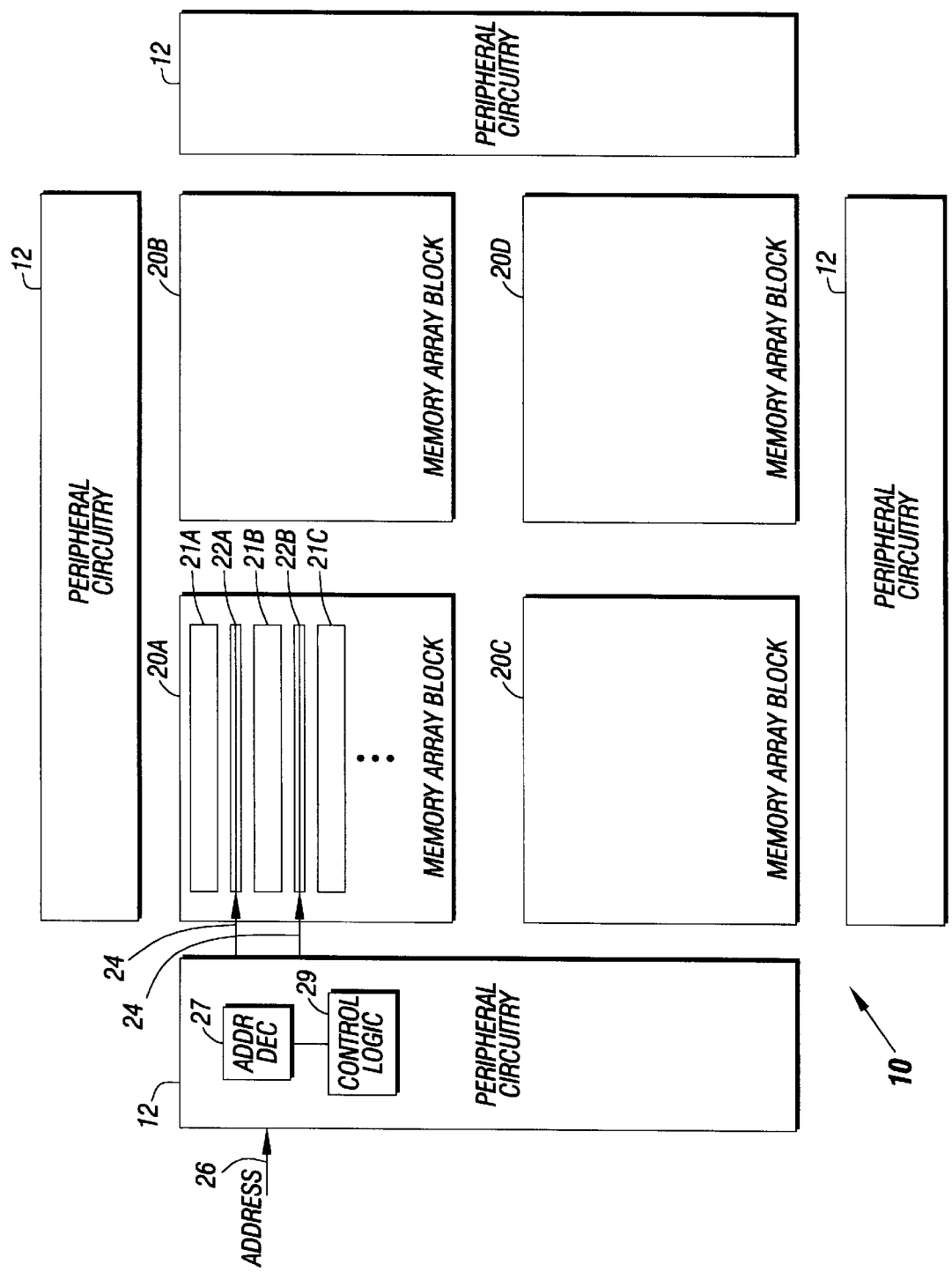
FIG. 1 is a block diagram of an embodiment of a memory device.

Referring to FIG. 1, a memory device 10 according to one example arrangement includes a memory core made up of four memory array blocks 20A, 20B, 20C, 20D and peripheral circuitry 12. The peripheral circuitry 12 may be placed on the outside of the memory array blocks 20 (as illustrated). In an alternate arrangement, the peripheral circuitry 12 may also be positioned between the memory array blocks 20. The memory device 10 may be any one of various types of devices, including dynamic random access memories (DRAMs), synchronous DRAMs (SDRAMs), Rambus DRAMs (RDRAMs), static RAMs (SRAMs), double data rate DRAMs (DDR DRAMs), and so forth. The memory device 10 may also be part of an integrated circuit (IC) device that includes other features. For example, some IC devices may include microcontrollers or microprocessors with embedded memory devices.

The peripheral circuitry 12 provides control signals into the memory array blocks 20A–20D for controlling various memory operations, including read, write, and refresh operations. In read operations, data is output from the memory arrays 20A–20D and stored in various latches and buffers in the peripheral circuitry 12 for output on output pins of the memory device. In write operations, write data received on data input pins by the peripheral circuitry 12 are written into the memory array blocks 12.

In the example arrangement, each memory array block 20 includes array strips (strips 21A–21C illustrated) of memory cells that are lined up generally horizontally across each memory array block 20. Row decoder groups 22 (22A and 22B illustrated in FIG. 1) are placed between the array strips 21A, 21B, and 21C. The row decoder groups 22 assert word lines to select rows of memory cells in the array strips 21.

An address decoder 27 in the peripheral circuitry 12 receives address signals (including row address signals and column address signals) on lines 26, which may be received from address input pins of the memory device 10. The row address signals are decoded by the address decoder 27 into row select signals that are processed by control logic 29 for routing on sets of signal lines 24 to the row decoder groups 22. The row select signals control selection of row decoders in the row decoder groups 22. One set of signal lines 24 is routed to decoders within each row decoder group 22 in the memory array block 20. In one embodiment, each set of signal lines 24 may include greater than eighteen lines. Thus, the routing space for the signal lines between the array strips 21 may contribute to a substantial portion of the area of each memory array block 20. To reduce the number of signal lines that need to be routed in the memory array block 20, certain signal lines are shared by row decoders in each row decoder group 22 in accordance with some embodiments.

In further embodiments, sharing of signal lines in a memory array may be applied to other control circuits in the memory array. For example, signal lines routed to column decoders, sense amplifiers, input/output circuitry, and other control circuits may also be shared. How signal lines are shared depends on the architecture of a particular memory array.

Figure 2:
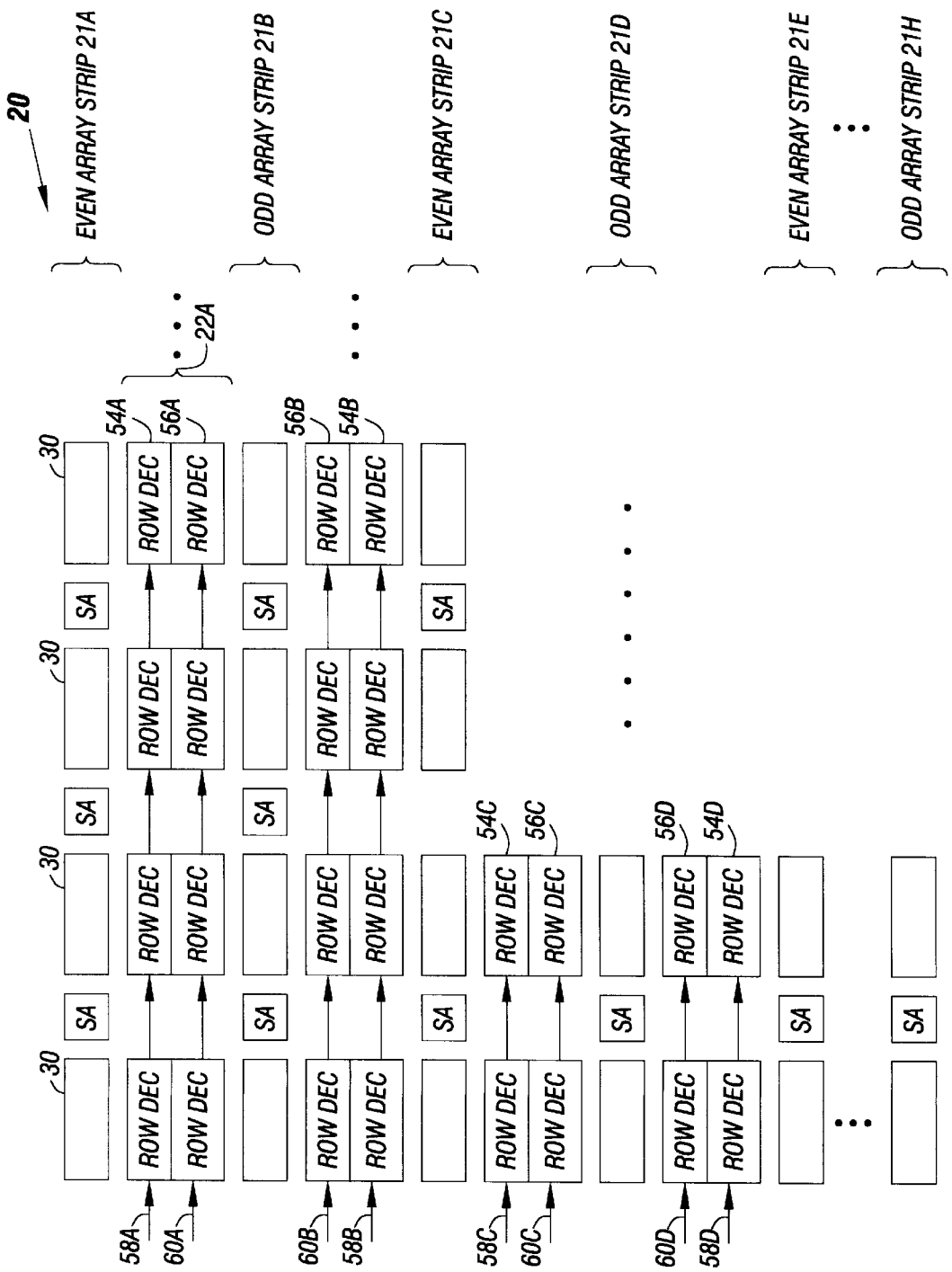
FIG. 2 illustrates an example arrangement of memory sub-arrays in the memory device of FIG. 1.

Referring to FIG. 2, in one embodiment, each memory array block 20 may be organized into a number of strips 21A–21H. Each strip includes sub-arrays 30, with sense amplifiers positioned between the sub-arrays 30 to read and write information into the memory cells in the sub-arrays 30. The memory arrangement as illustrated in FIG. 2 may be employed in RDRAMs, SDRAMs, and DDR DRAMs, in which large numbers of bits are retrieved at a time from the memory array for high-speed output. In other types of memory devices, the memory array may be divided into different arrangements of sub-arrays.

The array strips 21 may be designated as either an even array strip or an odd array strip. Successive array strips 21 alternate between even and odd strips. Thus, for example, the strips 21A, 21C, 21E, and so forth, are even array strips; and the strips 21B, 21D, 21H, and so forth, are odd array strips. The even array strips are selected while the odd array strips are deselected, and vice versa.

An array strip 21 when selected indicates that select signals to the row decoders associated with the selected array strip are activated to update or refresh internal states of the row decoders (to an active state or inactive). Deselection of an array strip does not necessarily mean that the row decoders of the deselected array strip 21 are deactivated. Rather, deselection of an array strip as used here refers to the deactivation of certain select signals to the row decoders of the deselected array strip. However, even though certain select signals have been deactivated, the internal states (active or inactive) of one or more row decoders associated with the deselected array strip may be held or maintained internally in the row decoders. Deselection may also refer to deactivation of the array strip. Further, as used here, selection and deselection of row decoders have similar meanings. Thus, a row decoder can be selected to allow its internal state to be updated to a different state or refreshed to the same state. A row decoder when deselected is able to maintain its internal state (active or inactive). Deselection of a row decoder can also mean deactivation of the row decoder. Further, as used here, selection of a set of row decoders means that one or more decoders in that set is selected.

As shown in FIG. 2, each row decoder group 22 includes two sets of row decoders 54 and 56, one used to drive row lines (including word lines) for the even array strip and one to drive row lines for the odd array strip. Thus, for example, the row decoder group 22A includes two sets of row decoders 54A and 56A. The row decoders 54A drive row lines in the sub-arrays 30 and 32 of the even array strip 21A, while the row decoders 56A drive row lines for the sub-arrays 34 and 36 in the odd array strip 21B. A similar arrangement exists for row decoders 54B (for even array strip 21C) and 56B (for odd array strip 21B) in the row decoder group 22B, row decoders 54C (for even array strip 21C) and 56C (for odd array strip 21D) in the row decoder group 22C; row decoders 54D (for even array strip 21E) and 56D (for odd array strip 21D) in the row decoder group 22D, and so forth. To reduce signal line routing space, some of the row select lines are shared by row decoders 54 and 56 routed to each row decoder group 22. Row select lines 58A are routed to even row decoders 54A, and row select lines 60A are routed to odd row decoders 56A. A similar arrangement is provided for the other row select lines 58 and 60 routed to other row decoders.

The row select lines 58 and 60 include row address select lines and bank select lines. In the one example arrangement, the row address select lines are designated as RA[0:7] and RB[0:7] lines, and the bank select lines are designated as BNK[0:1] lines. The BNK[0:1] lines select activation of one of the two banks in each array strip 21, while the row address select lines RA[7:0] and RB[7:0] perform one of 64 selection in the active bank.

In one embodiment, the RA, RB, and BNK control signals make up 18 signals. Thus, if individual sets of lines carrying the RA, RB, and BNK signals are provided to each row decoder group, 36 separate lines (18×2) would have to be routed to the row decoders 54 and 56 between each pair of array strips 21. In accordance with some embodiments, the number of signal lines that need to be routed through each memory array 20 is reduced by sharing some of these control lines between each pair of row decoders 54 and 56. One possibility is to share both RA and RB lines, with the BNK lines routed separately for the row decoders 54 and 56. Thus, instead of routing two sets of RA and RB lines, only one set needs to be provided in this configuration for each row decoder group 21, which results in space savings of 16 signal lines. In another configuration, the RB and BNK lines can be shared, with the RA lines routed individually for each of the row decoders 54 and 56, which results in space savings of 10 signal lines.

Figure 3A:
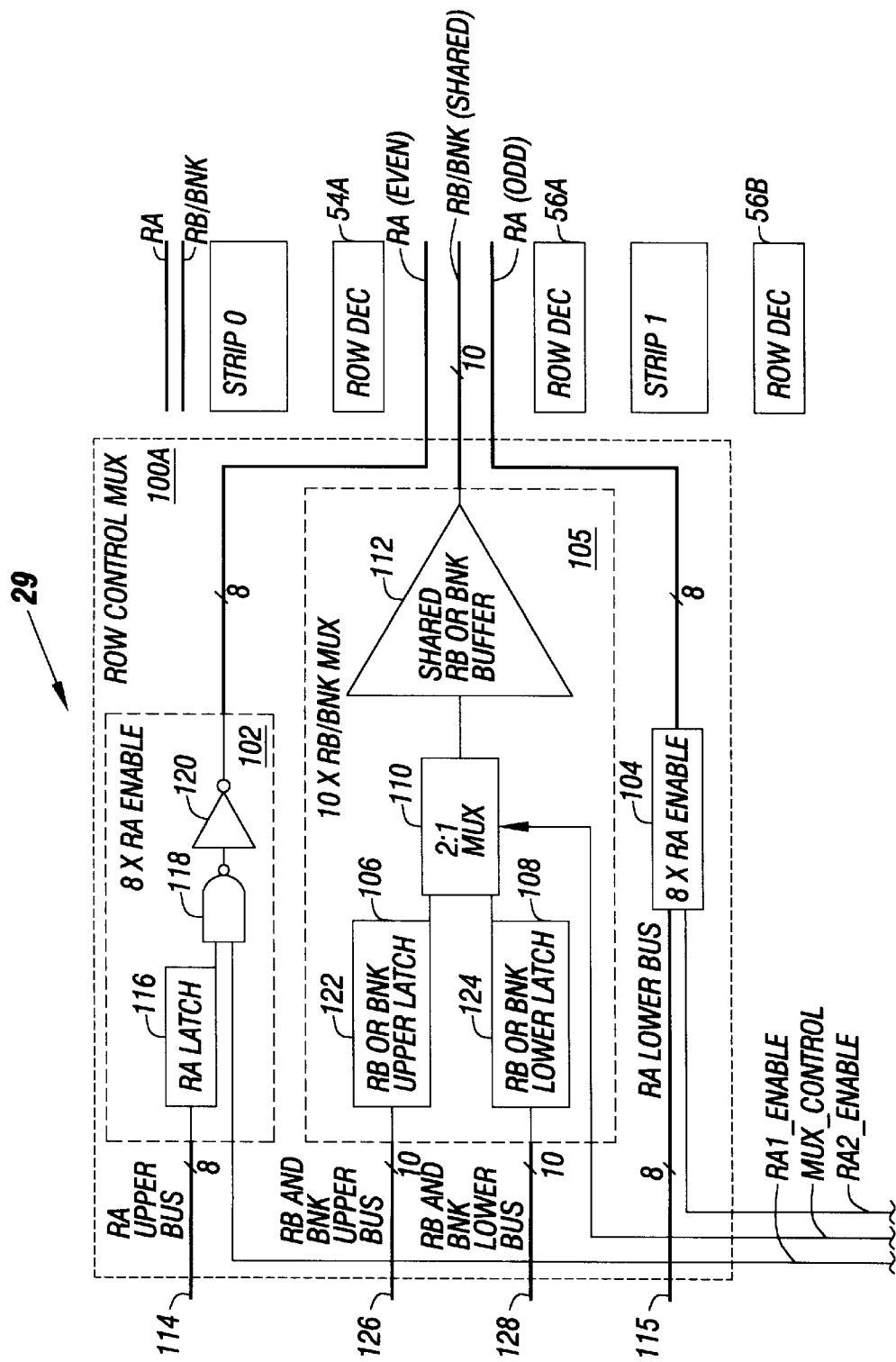
FIGS. 3A–3B are a block diagram of control logic for providing shared row control lines to row decoders in accordance with one embodiment in the memory device of FIG. 1.
Figure 3B:
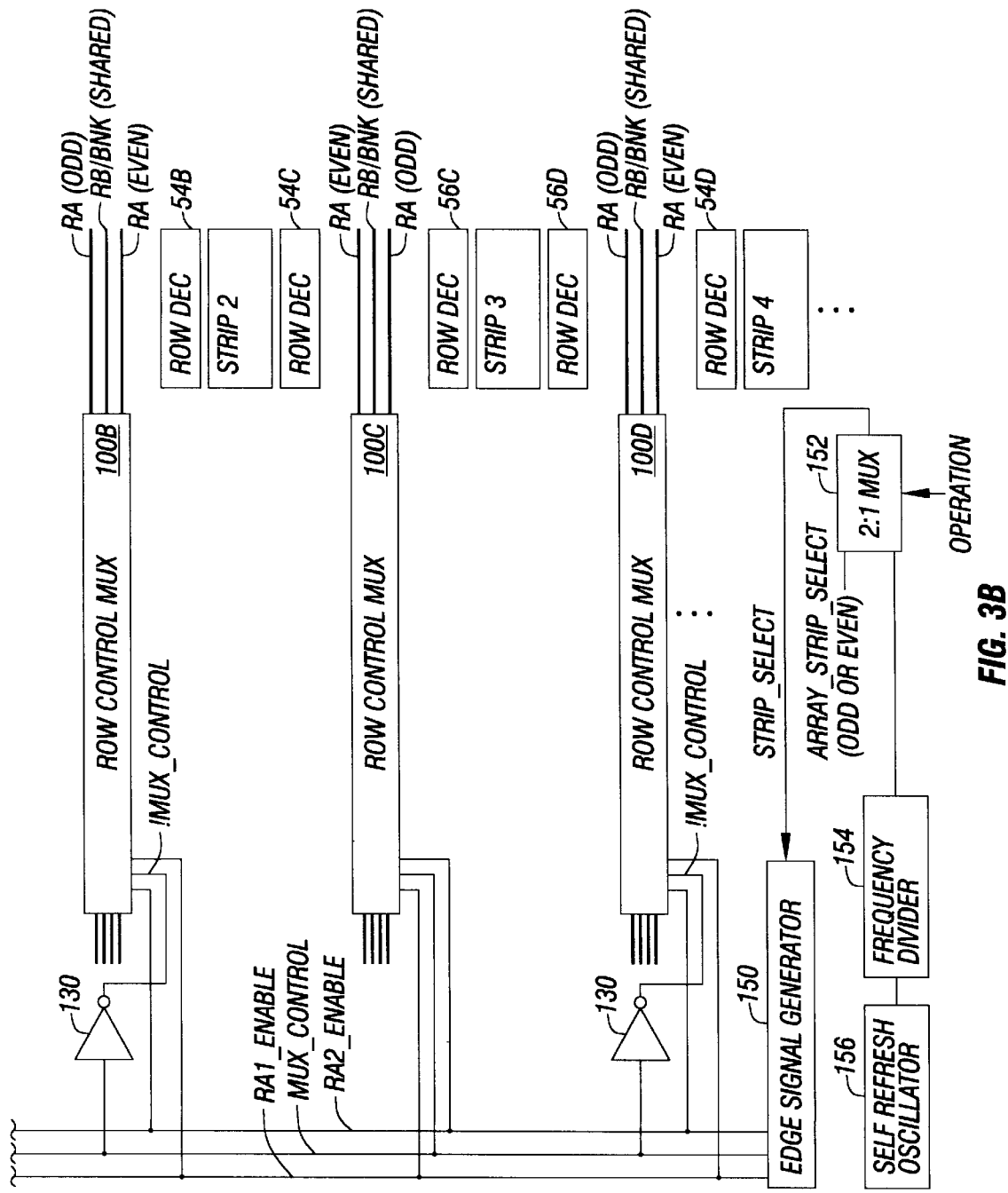

The following describes circuitry employed to implement sharing of the RB and BNK lines in accordance with one embodiment. Some modifications in the circuitry described may be employed for sharing RA and RB lines in another embodiment. Further, variations of the circuitry may be employed for sharing signal lines by other control circuits. Referring to FIGS. 3A–3B, the control logic 29 for generating the RA, RB, and BNK control lines is illustrated. The logic 29 includes row control multiplex circuits 100A, 100B, 100C, 100D, and so forth, to provide control signals on respective row select lines 58A, 60A; 58B, 60B; 58C, 60C; 58D, 60D; and so forth. The row select lines 58 for even row decoders 54 associated with the even array strips 21 include the following lines: separate RA lines for the even strips, represented as RA(even); and shared RB/BNK lines, designated as RB/BNK(shared). Similarly, the control lines 60 for the odd row decoders 56 associated with the odd array strips 21 include the following signals: separate RA lines, designated as RA(odd); and shared RB/BNK lines, designated as RB/BNK(shared). The RB/BNK(shared) lines are shared between each pair of row decoders 54 and 56. The RA, RB, and BNK lines routed on the top edge of each memory array are not shared. Similarly, the RA, RB, and BNK lines routed on the bottom edge of the memory array 20 are not shared.

Each row control decoder 100 includes several components, including a set of upper RA enable circuits 102 (a set of eight in one embodiment) that provides signals over one of the RA(even) or RA(odd) lines, depending on whether the upper RA decoder 102 is outputting even or odd row select signals. Each row control multiplex circuit 100 also includes a set of lower RA enable circuits 104 (a set of eight in one embodiment) to provide signals over one of the RA(odd) or RA(even) lines. In the illustrated arrangement of FIGS. 3A–3B, the upper RA enable circuit 102 in the row control decoder 100A drives RA(even) lines, while the lower RA enable circuit 104 drives RA(odd) lines. In the next row control multiplex circuit 100B, the arrangement is reversed with the upper RA enable circuit 102 driving RA(odd) lines and the lower RA enable circuit 104 driving RA(even) lines. The alternating arrangement is repeated for the remaining row control multiplex circuits 100C, 100D, and so forth.

In the first row control multiplex circuit 100A, each upper RA enable circuit 102 is coupled to an input bus 114 to receive the states of an even RA signal, which is stored into an RA latch 116. The output of the latch 116 is connected to one input of a NAND gate 118, whose other input is connected to a signal RA1_ENABLE that is provided by an edge signal generator 150. The output of the NAND gate 118 goes through an inverter 120 to drive a corresponding one of the RA(even) lines. The internal logic of each lower RA enable circuit 104 in the first row control multiplex circuit 100A is the same as each upper RA enable circuit 102, except that each lower RA enable circuit 104 is controlled by a signal RA2_ENABLE and drives a corresponding RA(odd) line. In the next row control multiplex circuit 100B, each upper RA enable circuit 102 receives odd RA signals and RA2_ENABLE, while each lower RA enable circuit 104 receives even RA signals and RA1_ENABLE. This arrangement is the reverse of that in the row control multiplex circuit 100A. The arrangement is similarly alternated for the remaining row control multiplex circuits 100. This is due to the fact that the placement of RA(even) and RA(odd) lines are switched in successive row decoder groups 22 due to the alternating orientation (above or below) of the even and odd array strips 21 to the row decoder groups 22.

The RB/BNK(shared) lines are driven by a set of RBIBNK multiplex circuits 105 (a set of ten in one embodiment, eight for RB and two for BNK). Each RB/BNK multiplex circuit 105 includes a buffer 112 to drive a corresponding one of the RB/BNK(shared) lines. The input of the buffer 112 is connected to a 2:1 multiplexer 110, whose first input is connected to an upper latch 122 and whose second input is connected to a lower latch 124. The upper latch 122 is coupled to a bus 126 to receive RB and BNK signals associated with one of the even and odd row decoders 54 and 56, while the lower latch 124 is coupled to a bus 128 to receive the RB and BNK signals associated with the other one of the even and odd row decoders 54 and 56. The select input of the multiplexer 110 is provided by the edge signal generator 150.

In accordance with one embodiment, the select input of the multiplexers 110 in the several row control multiplex circuits 100 receive either the non-inverted or the inverted state of a signal MUX_CONTROL. The inverted state of the signal MUX_CONTROL is provided by inverters 130, with the inverted signal referred to as !MUX_CONTROL. In row control multiplex circuits 100 that are controlled by MUX_CONTROL, the upper latch 122 receives an even RB or BNK signal while the lower latch 124 receives an odd RB or BNK signal. On the other hand, in row control multiplex circuits 100 that are controlled by !MUX_CONTROL, the upper latch 122 receives an odd RB or BNK signal while the lower latch 124 receives an even RB or BNK signal.

In the example arrangement shown, driving MUX_CONTROL low causes the even RB and BNK signals to be driven onto the RB/BNK(shared) lines, while driving MUX_CONTROL high causes the odd RB and BNK signals to be driven onto the RB/BNK(shared) lines.

Thus, in accordance with some embodiments, the RB/BNK (shared) lines alternate between carrying even and odd RB or BNK signals. If the even row decoders 54 are to be selected, then the RB/BNK (shared) lines carry even RB and BNK signals. On the other hand, if the odd row decoders 56 are to be selected, then the RB/BNK(shared) lines carry odd RB and BNK signals.

To select whether the RA(even) or RA(odd) lines are active, one of the RA1_ENABLE and RA2_ENABLE signals is activated. The signals RA1_ENABLE, RA2_ENABLE, and MUX_CONTROL are provided by the edge signal generator 150 in response to the state of an input signal STRIP_SELECT that is output from a 2:1 multiplexer 152. During normal operations (e.g., read, write, and refresh), the state of STRIP_SELECT is controlled by a signal ARRAY_STRIP_SELECT that is at one state to indicate selection of odd array strips and at a second state to indicate selection of even array strips. However, when the memory device is inactive, the state of STRIP_SELECT is controlled by an oscillating signal from a frequency divider circuit 154, whose input is coupled to the output of an oscillator 156 (e.g., a self-refresh oscillator used in some memory devices). The frequency divider circuit 154 alternates STRIP_SELECT between high and low states at a predetermined frequency. Cycling STRIP_SELECT between selection of the even and odd row decoders 54 and 56 when the memory device 10 is inactive is performed to refresh internal states of those row decoders to allow them to maintain row lines at active states. It is noted that refreshing the internal states of the row decoders 54 and 56 is distinct from regular refresh cycles performed by memory devices such as DRAMs, SDRAMs, RDRAMs, and other like devices to refresh the states of memory cells.

Figure 4:
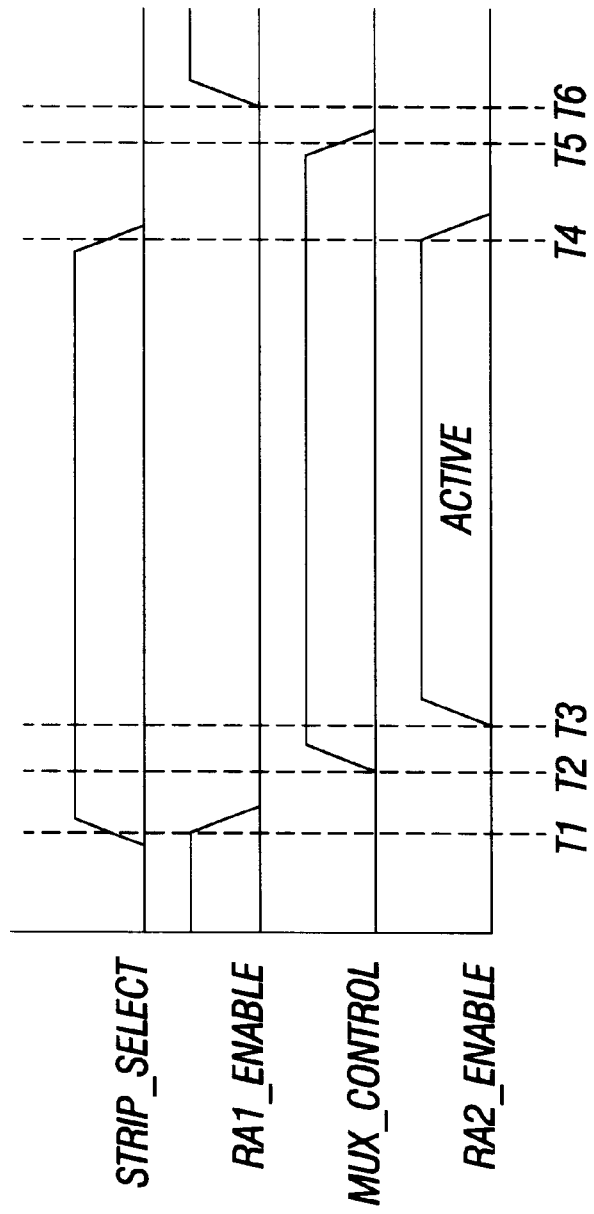
FIG. 4 is a timing diagram of signals that are input to and output from a signal generator in the control logic of FIGS. 3A–3B.

Referring further to FIG. 4, the signals STRIP_SELECT, RA1_ENABLE, MUX_CONTROL and RA2_ENABLE that are input to, or output from, the edge signal generator 150 are illustrated. At time T1, the input signal STRIP_SELECT transitions from a low state to a high state to indicate changing selection to odd row decoders 56 associated with odd array strips 21. In response, the edge signal generator 150 drives the signal RA1_ENABLE low to disable even RA signals. At time T2, the signal MUX_CONTROL goes high to select the odd RB and BNK signals contained in latches 122 and 124 to drive onto the RB/BNK (shared) lines. At time T3, the signal RA2_ENABLE is activated to select the RA enable circuits 102 or 104 that drive RA(odd) lines.

Subsequently, the signal STRIP_SELECT may be driven low at time T4 to select even array strips. In response, the signal RA2_ENABLE is driven low at a little past time T4. Next, at time T5, the signal MUX_CONTROL is driven low to select the RB and BNK signals from the even RB and BNK latches 122 and 124 to present onto the RB/BNK (shared) lines. Next, at time T6, the signal RA1_ENABLE is driven high to enable the RA decoders 102 or 104 that drive RA(even) lines.

Figure 5:
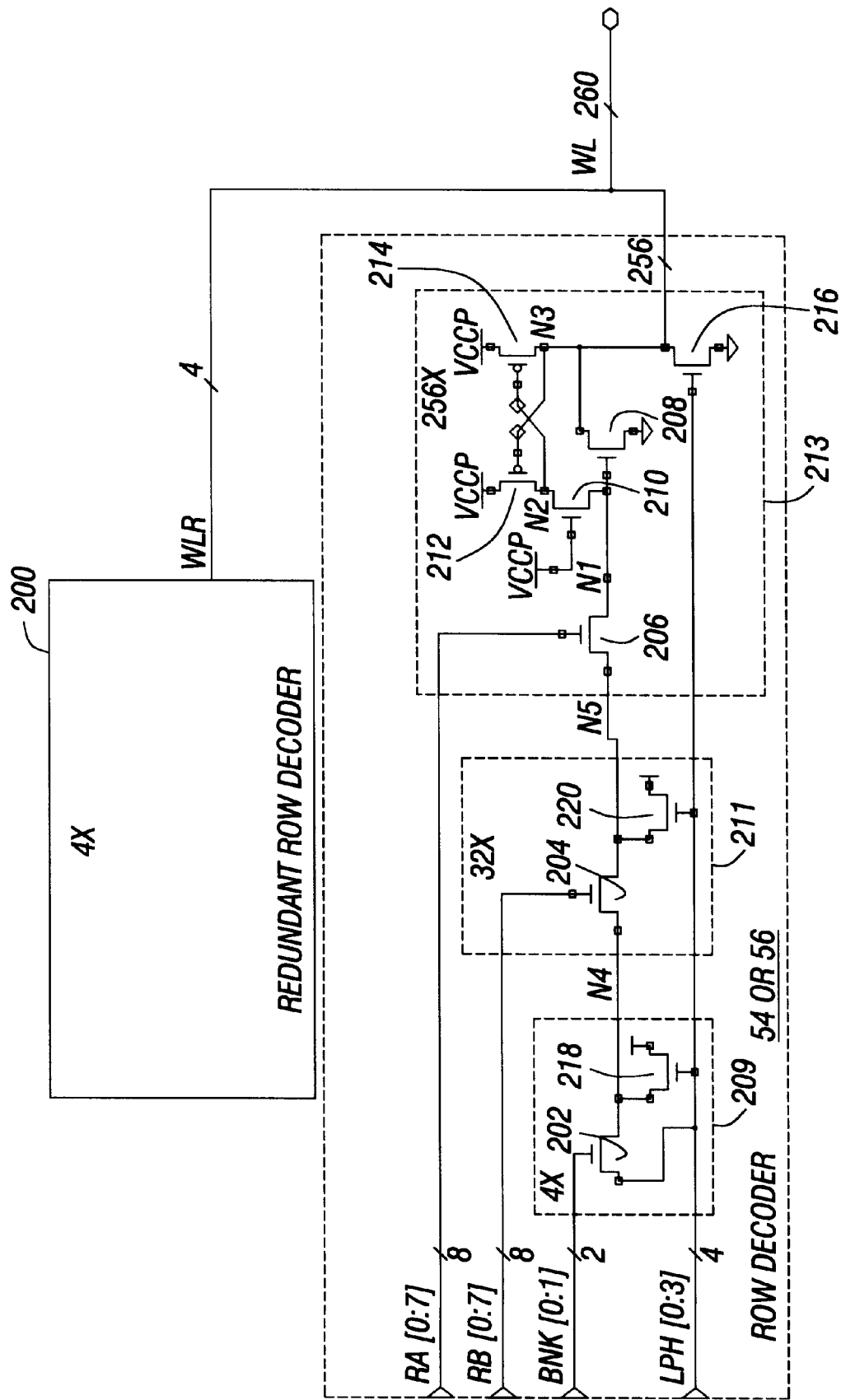
FIG. 5 is a circuit diagram of row decoders in accordance with one embodiment in the memory device of FIG. 1.

Referring to FIG. 5, a row decoder 54 or 56 is illustrated in greater detail. In addition to the regular row decoder 54 or 56, redundant row decoders 200 (four in one embodiment) drive four redundant word line WLRs. In the illustrated embodiment, the row decoders 54 or 56 receive the following row control signals: RA[0:7], RB[0:7], and BNK[0:1]. In addition, the row decoders 54 or 56 receive phase signals LPH[0:3]_. The signals LPH[0:3]_ provide further selection of the row decoders 54 and 56 in combination with the RA[0:7] and RB[0:7] signals.

Each set of row decoders 54 or 56 is divided into three portions 209, 211, and 213. The bank decoder portion 209 is repeated four times, with each instance outputting a signal (referred to as node N4) to a set of eight RB decoder portions 211 (32 RB decoder portions in total for each set of row decoders 54 or 56). Each instance of the RB decoder portion 211 outputs a signal (referred to as node N5) to a set of eight RA decoder portions 213 (256 RA decoder portions in total for each set of row decoders). The RA decoder portions 213 drive 256 word line (WL) signals. In the following, one instance of each of the bank decoder portion 209, RB decoder portion 211, and RA decoder portion is described.

Three N-channel metal-oxide-silicon field effect transistors (MOSFETs) are arranged in series, with the gate of a first transistor 202 controlled by a bank select signal BNK, the gate of the second transistor 204 controlled by RB, and the gate of the third transistor 206 controlled by RA. If all three row control signals RA, RB, and BNK are true (active high), then the state of the phase control signal LPH_ (which is active low) is provided through the transistors 202, 204 and 206 to a node N1 that is connected to the gate of an N-channel MOSFET 208 and the source an N-channel MOSFET 210. The gate of the transistor 210 is coupled to the elevated voltage VCCP so that the voltage on node N1 is passed to node N2 through the transistor 210. Node N2 is connected to the source of a P-channel MOSFET 212 as well as to the gate of a P-channel MOSFET 214. An active low state of LPH_ is thus communicated through 202, 204, 206, and 210 to node N2, which activates the transistor 214 to allow the state of VCCP to pass to node N3, which is further coupled to the gate of the transistor 212. Node N3 transitioning high shuts off the transistor 212 so that node N3 is driven to the state VCCP, which drives a connected word line WL to the voltage VCCP to activate a row in the memory array. The node N3 is further connected to the drain of an N-channel MOSFET 216, which is off when the state of LPH_ is low.

The signal LPH_ is further connected to the gates of N-channel MOSFETs 218 and 220, whose drains are coupled to supply voltage VCC and whose sources are connected to nodes N4 and N5, respectively. Thus, when the phased signal LPH_ is deactivated high, the transistors 216, 218 and 220 are turned on, which causes nodes N4 and N5 to transition to the voltage VCC less a threshold drop across transistors 218 and 220, respectively. In addition, the activated transistor 216 pulls node N3 low to thereby drive the word line WL low. N3 going low causes the transistor 212 to turn on, so that node N2 is coupled to the voltage VCCP. This in turn turns off the transistor 214. As a result, node N1 is pulled to a voltage that is equal to VCCP less the threshold drop across transistor 210. This activates the transistor 208 to connect the node N3 to a low voltage through the transistor 208.

Thus, when all three row control signals of the RA, RB, and BNK are active high (indicating that the row decoder instance has been selected), the state of node N1 in the RA decoder portion 213 is driven to the state of LPH_. In the selected state, node N1 is referred to as being "statically" held by the state of LPH_. However, if any one of the RA, RB, and BNK signals is low (indicating that the row decoder instance has been deselected), then node N1 can be "dynamically" held if LPH_ remains active low. Node N1 is dynamically held by the capacitance of the node. If LPH_ goes inactive high, however, the state of N1 is driven high to deactivate the RA decoder portion 213.

Some embodiments of the invention may offer one or more of the following advantages. By sharing some of the row select lines routed to row decoders in a memory array, memory device space savings may be achieved since less signal lines are needed to route select signals to the row decoders. Such space savings allow die sizes to decrease, which reduces cost by improving yield (if more dies can be made on a given wafer) and by reducing the likelihood of damage to each die. Further, dies having smaller areas may be fitted into smaller package sizes, which reduces the footprint of a packaged integrated circuit device on a circuit board.

While the invention has been disclosed with respect to a limited number of embodiments, those skilled in the art will appreciate numerous modifications and variations therefrom. It is intended that the appended claims cover all such modifications and variations as fall within the true spirit and scope of the invention.

What is claimed is:

1. A memory device, comprising:
   a memory array;
   at least two sets of decoders adapted to drive control lines in the memory array; and
   select lines coupled to the decoders, and providing first select signals to the first set of decoders and second select signals to the second set of decoders, at least some of the select lines alternating between carrying the first and second select signals.

2. The memory device of claim 1, wherein the decoders include row decoders adapted to drive word lines.

3. The memory device of claim 2, wherein the select lines include row select lines carrying row select signals to enable selection of one or more row decoders in one of the first and second sets of decoders while the other set is deselected.

4. The memory device of claim 1, wherein the two sets of decoders are selected one set at a time.

5. The memory device of claim 4, wherein signals carried on the select lines control selection of one or more of the decoders in the selected set of decoders.

6. A memory device, comprising:
   a memory array;
   at least two sets of row decoders to drive row lines in the memory array; and
   select lines carrying signals to select one or more decoders in one of the two sets of decoders, wherein at least some of the select lines are shared between the two sets of row decoders.

7. The memory device of claim 6, further comprising address decoder logic receiving address signals and converting them into signals to be communicated over the select lines.

8. The memory device of claim 6, further comprising logic adapted to drive the select lines, the logic including multiplexer circuitry to select signals associated with the first set of decoders or second set of decoders to provide onto the shared select lines.

9. The memory device of claim 6, further comprising a first memory array and a second memory array, a first set of row decoders driving row lines in the first memory array and a second set of row decoders driving row lines in the second memory array.

10. A memory device, comprising:
    a plurality of memory array strips each including a portion of a memory array;

at least two sets of decoders positioned between two memory array strips; and control lines routed to the at least two sets of decoders to control selection of the decoders, at least some of the control lines being shared between the at least two sets of decoders.

11. The memory device of claim 10, wherein the at least two sets of decoders are alternately selected so that when one set is selected the other set is deselected, the shared control lines carrying signals associated with the selected set of decoders.

12. The memory device of claim 10, wherein the decoders are row decoders.

13. An integrated circuit device, comprising:

a plurality of memory cells;

first control circuits to drive control lines to a first set of memory cells;

second control circuits to drive control lines to a second set of memory cells; and select lines coupled to both the first and second control circuits alternately carrying select signals associated with the first and second control circuits.

14. The integrated circuit device of claim 13, wherein the control circuits include row decoders.

15. A method of controlling access of memory cells in an integrated circuit device, comprising:

providing signal lines to at least two sets of decoders that drive control lines to the memory cells;

alternately driving select signals associated with one of the two sets of decoders on the signal lines; and selecting one or more of the decoders in one of the two sets with the select signals.

16. The method of claim 15, wherein driving the select signals includes driving row select signals.

17. The method of claim 15, further comprising asserting by one of the activated decoders a control line to the memory cells.

18. A circuit, comprising:

a decoder driving row select signals onto shared signal lines for alternately controlling selection of a first set and a second set of row decoders; and a multiplexer to select first row select signals or second row select signals for communicating on the shared signal lines.

19. A memory array, comprising:

a first and a second row decoder capable of driving control lines in the memory array; and a select line capable of carrying a signal to select at least one of the first row decoder and the second row decoder, wherein the select line is shared by the first and second row decoder.

20. The memory array of claim 19, wherein the first row decoder and second row decoder are adapted to drive word lines.

21. The memory array of claim 19, wherein the first row decoder and second row decoder comprise a set of row decoders adapted to drive control lines in the memory array.

22. The memory array of claim 21, further including a plurality of select lines coupled to the set of decoders, wherein at least some of the plurality of select lines are shared between the set of decoders.

23. A memory device, comprising:

a memory array;

a first and a second decoder capable of driving control lines in the memory array; and an address decoder coupled to the first and second decoder by at least one select line, wherein the at least one select line is shared by the first and second decoder.

24. The memory device of claim 23, wherein the first and second decoder are row decoders.

25. The memory device of claim 23, wherein the first and second decoder are column decoders.

26. The memory device of claim 23, wherein the first decoder and second decoder comprise a set of decoders adapted to drive control lines in the memory array.

27. The memory device of claim 26, further including a plurality of select lines coupled to the set of decoders, wherein at least some of the plurality of select lines are shared between the set of decoders.

28. The memory device 23, wherein the first decoder and second decoder comprise a set of decoders adapted to drive control lines in the memory array.

* * * * *